(12) United States Patent
Ikejiri

(10) Patent No.: US 7,541,601 B2
(45) Date of Patent: Jun. 2, 2009

(54) ION BEAM IRRADIATING APPARATUS AND METHOD OF ADJUSTING UNIFORMITY OF A BEAM

(75) Inventor: Tadashi Ikejiri, Kyoto (JP)

(73) Assignee: Nissin Ion Equipment Co., Ltd., Kyoto (JP)

(*) Notice: Subject to any disclaimer, the term of this patent is extended or adjusted under 35 U.S.C. 154(b) by 346 days.

(21) Appl. No.: 11/640,931

(22) Filed: Dec. 19, 2006

(65) Prior Publication Data

US 2008/0073581 A1    Mar. 27, 2008

(30) Foreign Application Priority Data

Dec. 20, 2005    (JP)    ............ P.2005-366499

(51) Int. Cl.
*G21K 5/10*    (2006.01)
*H01J 37/08*    (2006.01)

(52) U.S. Cl. .............. 250/492.21; 250/492.1; 250/492.2; 250/397; 250/398; 355/30; 355/55; 355/67; 355/68; 355/69; 355/70; 355/71; 356/34; 356/400; 356/401

(58) Field of Classification Search .......... 250/492.1, 250/492.2, 492.21, 397, 398; 355/53, 30, 355/67–71; 356/34, 400, 401
See application file for complete search history.

(56) References Cited

U.S. PATENT DOCUMENTS 7,030,958 B2 * 4/2006 Luijkx et al. ............... 355/30

FOREIGN PATENT DOCUMENTS

JP    6-342639    12/1994

* cited by examiner

Primary Examiner—Jack I Berman
Assistant Examiner—Meenakshi S Sahu
(74) Attorney, Agent, or Firm—Finnegan, Henderson, Farabow, Garrett & Dunner, L.L.P.

(57) ABSTRACT

An ion beam irradiating apparatus has: a beam profile monitor 14 which measures a beam current density distribution in y direction of an ion beam 4 in the vicinity of a target 8; movable shielding plate groups 18a, 18b respectively having plural movable shielding plates 16 which are arranged in the y direction so as to be opposed to each other across an ion beam path on an upstream side of the position of the target, the movable shielding plates being mutually independently movable in x direction; shielding-plate driving devices 22a, 22b which reciprocally drive the movable shielding plates 16 constituting the groups, in the x direction in a mutually independent manner; and a shielding-plate controlling device 24 which, on the basis of measurement information obtained by the monitor 14, controls the shielding-plate driving devices 22a, 22b to relatively increase an amount of blocking the ion beam 4 by the opposed movable shielding plates 16 which correspond to a position where a measured y-direction beam current density is relatively large, thereby uniformity of the beam current density distribution in the y direction.

10 Claims, 11 Drawing Sheets

ION BEAM IRRADIATING APPARATUS AND METHOD OF ADJUSTING UNIFORMITY OF A BEAM

TECHNICAL FIELD

The present disclosure relates to an ion beam irradiating apparatus which irradiates a target with an ion beam having a so-called ribbon-like (this may be also called a sheet-like or a strip-like, and the same will apply hereinafter) shape where the size in y direction (longitudinal direction) in a plane intersecting with the traveling direction is larger than that in x direction perpendicular to the y direction, thereby performing ion implantation or the like, and also to a method of adjusting uniformity of a beam which improves uniformity of the beam current density distribution in the y direction of the ion beam. In the specification, a ribbon-like ion beam includes an ion beam which has a ribbon-like shape without undergoing scanning in the y direction, and that which has a ribbon-like shape after undergoing scanning in the y direction.

RELATED ART

In the case where a target (for example, a semiconductor substrate, or a glass substrate) is irradiated with such a ribbon-like ion beam to apply a process such as ion implantation on the target, in order to enhance uniformity of the process in the y direction, it is important to improve uniformity of the beam current density distribution in the y direction of the ion beam impinging on the target.

In order to improve uniformity of the beam current density distribution in the longitudinal direction of a ribbon-like ion beam, in the related art, the beam current density distribution is adjusted by diverging or focusing the ion beam by means of a magnetic field at plural adjusting places in the longitudinal direction of the ion beam as disclosed in, for example, Patent Reference 1 (Japanese Patent Unexamined Publication No. 6-342639 (Paragraphs 0007 and 0008, FIG. 1)).

In the related art, as a result that the ion beam is diverged or focused at plural adjusting places in order to adjust the beam current density distribution, the traveling direction and divergence angle of the ion beam which has passed the adjusting places are changed. Hence, there arises a problem in that the parallelism and divergence angle of the ion beam (the whole ion beam) are adversely affected. Namely, there is a problem in that it is difficult to maintain the parallelism and divergence angle of the ion beam within a constant level, and hence the quality of the ion beam is impaired. This is applicable also to the case where the ion beam is diverged or focused by means of an electric field.

SUMMARY

Embodiments of the present invention provide an apparatus and method which can improve uniformity of a beam current density distribution in y direction (longitudinal direction) of an ion beam without adversely affecting the parallelism and divergence angle of the ion beam.

A first ion beam irradiating apparatus of the invention is an ion beam irradiating apparatus which irradiates a target with an ion beam having a shape where a size in y direction in a plane intersecting with a traveling direction is larger than a size in x direction perpendicular to the y direction, wherein the apparatus comprises: a beam profile monitor which measures a beam current density distribution in at least the y direction of the ion beam in a vicinity of a position of the target; a plurality of movable shielding plates which are arranged on at least one side in the x direction of an ion beam path on an upstream side of the position of the target, the movable shielding plates being mutually independently movable along the x direction, and blocking the ion beam; a shielding-plate driving device which reciprocally drives the plurality of movable shielding plates along the x direction in a mutually independent manner; and a shielding-plate controlling device which controls the shielding-plate driving device on a basis of measurement information obtained by the beam profile monitor, and which performs at least one of: a relative increase of an amount of blocking the ion beam by the movable shielding plates which correspond to a position where a measured y-direction beam current density is relatively large; and a relative decrease of an amount of blocking the ion beam by the movable shielding plates which correspond to a position where the measured y-direction beam current density is relatively small, thereby performing a control of improving uniformity of a y-direction beam current density distribution.

A second ion beam irradiating apparatus of the invention is an ion beam irradiating apparatus which irradiates a target with an ion beam having a shape where a size in y direction in a plane intersecting with a traveling direction is larger than a size in x direction perpendicular to the y direction, wherein the apparatus comprises: a beam profile monitor which measures a beam current density distribution in at least the y direction of the ion beam in a vicinity of a position of the target; a first movable shielding plate group having a plurality of movable shielding plates which are arranged in the y direction on one side in the x direction of an ion beam path on an upstream side of the position of the target, the first movable shielding plates being mutually independently movable along the x direction, and blocking the ion beam; a second movable shielding plate group having a plurality of movable shielding plates which are arranged in the y direction on another side in the x direction of the ion beam path on an upstream side of the position of the target, so as to be respectively opposed in the x direction to the shielding plates constituting the first movable shielding plate group across the ion beam path, the second movable shielding plates being mutually independently movable along the x direction, and blocking the ion beam; a first shielding-plate driving device which reciprocally drives the movable shielding plates constituting the first movable shielding plate group, along the x direction in a mutually independent manner; a second shielding-plate driving device which reciprocally drives the movable shielding plates constituting the second movable shielding plate group, along the x direction in a mutually independent manner; and a shielding-plate controlling device which controls the first and second shielding-plate driving devices on a basis of measurement information obtained by the beam profile monitor, and, by a substantially same distance in opposite directions along the x direction, moves movable shielding plates which are opposed to each other across the ion beam path, among the movable shielding plates constituting the first and second movable shielding plate groups, to perform at least one of: a relative increase of an amount of blocking the ion beam by the opposed movable shielding plates which correspond to a position where a measured y-direction beam current density is relatively large; and a relative decrease of an amount of blocking the ion beam by the opposed movable shielding plates which correspond to a position where the measured y-direction beam current density is relatively small, thereby performing a control of improving uniformity of a y-direction beam current density distribution.

In the first and second ion beam irradiating apparatuses, in accordance with the level of the beam current density in the y direction, the control in which the movable shielding plates are moved so as to solve the level change is performed. Accordingly, uniformity of the beam current density distribution in the y direction can be improved.

A third ion beam irradiating apparatus of the invention is that in the first or second ion beam irradiating apparatus, the movable shielding plates are placed so that the movable shielding plates are inclined with respect to the y direction, adjacent ones of the movable shielding plates are separated from each other, and a gap in the traveling direction of the ion beam is not formed between adjacent ones of the movable shielding plates.

A first method of adjusting uniformity of a beam of the invention is an adjusting method which irradiates a target with an ion beam having a shape where a size in y direction in a plane intersecting with a traveling direction is larger than a size in x direction perpendicular to the y direction, wherein the method uses: a beam profile monitor which measures a beam current density distribution in at least the y direction of the ion beam in a vicinity of a position of the target; and a plurality of movable shielding plates which are arranged in the y direction on at least one side in the x direction of an ion beam path on an upstream side of the position of the target, the movable shielding plates being mutually independently movable along the x direction, and blocking the ion beam, and performs, on the basis of measurement information obtained by the beam profile monitor, at least one of: a process in which movable shielding plates which correspond to a position where a measured y-direction beam current density is relatively large are moved along the x direction to relatively increase an amount of blocking the ion beam by the movable shielding plates; and a process in which movable shielding plates which correspond to a position where the measured y-direction beam current density is relatively small are moved along the x direction to relatively decrease the amount of blocking the ion beam by the movable shielding plates, thereby improving uniformity of a y-direction beam current density distribution.

A second method of adjusting uniformity of a beam of the invention is an adjusting method which irradiates a target with an ion beam having a shape where a size in y direction in a plane intersecting with a traveling direction is larger than a size in x direction perpendicular to the y direction, wherein the method uses: a beam profile monitor which measures a beam current density distribution in at least the y direction of the ion beam in a vicinity of a position of the target; and a first movable shielding plate group having a plurality of movable shielding plates which are arranged in the y direction on one side in the x direction of an ion beam path on an upstream side of the position of the target, the first movable shielding plates being mutually independently movable along the x direction, and blocking the ion beam; and a second movable shielding plate group having a plurality of movable shielding plates which are arranged in the y direction on another side in the x direction of the ion beam path on an upstream side of the position of the target, so as to be respectively opposed in the x direction to the shielding plates constituting the first movable shielding plate group across the ion beam path, the second movable shielding plates being mutually independently movable along the x direction, and blocking the ion beam, and, on the basis of measurement information obtained by the beam profile monitor, by a substantially same distance in opposite directions along the x direction, moves movable shielding plates which are opposed to each other across the ion beam path, among the movable shielding plates constituting the first and second movable shielding plate groups, to perform at least one of: a relative increase of an amount of blocking the ion beam by the opposed movable shielding plates which correspond to a position where a measured y-direction beam current density is relatively large; and a relative decrease of an amount of blocking the ion beam by the opposed movable shielding plates which correspond to a position where the measured y-direction beam current density is relatively small, thereby improving uniformity of a y-direction beam current density distribution.

The movable shielding plates are placed so that the movable shielding plates are inclined with respect to the y direction, adjacent ones of the movable shielding plates are separated from each other, and a gap in the traveling direction of the ion beam is not formed between adjacent ones of the movable shielding plates.

A third method of adjusting uniformity of a beam of the invention is that in the first or second adjusting method, the movable shielding plates are placed so that the movable shielding plates are inclined with respect to the y direction, adjacent ones of the movable shielding plates are separated from each other, and a gap in the traveling direction of the ion beam is not formed between adjacent ones of the movable shielding plates Various implementations may include one or more the following advantages.

According to the first ion beam irradiating apparatus, the amount of blocking the ion beam by the movable shielding plates can be automatically controlled, so that uniformity of the beam current density distribution in the y direction (longitudinal direction) of the ion beam is improved. In the invention, furthermore, the ion beam is not diverged or focused at adjusting places by means of a magnetic field or an electric field, and hence the parallelism and divergence angle of the ion beam are not adversely affected.

According to the second ion beam irradiating apparatus, the same effects as those of the first ion beam irradiating apparatus are attained. Furthermore, the control is performed so that, among the movable shielding plates constituting the first and second movable shielding plate groups, shielding plates which are opposed to each other across the ion beam path are moved by a substantially same distance in opposite directions along the x direction. Therefore, it is possible to attain an effect that, even when the amount of blocking the ion beam by the movable shielding plates is changed, the center position in the x direction of the ion beam passing between opposed movable shielding plates is not shifted.

According to the third ion beam irradiating apparatus, it is possible to attain a further effect that, while preventing adjacent movable shielding plates from rubbing with each other to produce particles, the ion beam can be prevented from leaking from a gap between adjacent movable shielding plates toward the downstream side.

According to the first adjusting method, the amount of blocking the ion beam by the movable shielding plates can be adjusted, so that uniformity of the beam current density distribution in the y direction (longitudinal direction) of the ion beam is improved. In the invention, furthermore, the ion beam is not diverged or focused at adjusting places by means of a magnetic field or an electric field, and hence the parallelism and divergence angle of the ion beam are not adversely affected.

According to the second adjusting method, the same effects as those of the first adjusting method are attained. Furthermore, among the movable shielding plates constituting the first and second movable shielding plate groups, movable shielding plates which are opposed to each other across the ion beam path are moved by a substantially same distance in opposite directions along the x direction. Therefore, it is possible to attain an effect that, even when the amount of blocking the ion beam by the movable shielding plates is changed, the center position in the x direction of the ion beam passing between opposed movable shielding plates is not shifted.

According to the third adjusting method, it is possible to attain a further effect that, while preventing adjacent movable shielding plates from rubbing with each other to produce particles, the ion beam can be prevented from leaking from a gap between adjacent movable shielding plates toward the downstream side.

Other features and advantages may be apparent from the following detailed description, the accompanying drawings and the claims.

DETAILED DESCRIPTION

Figure 1:
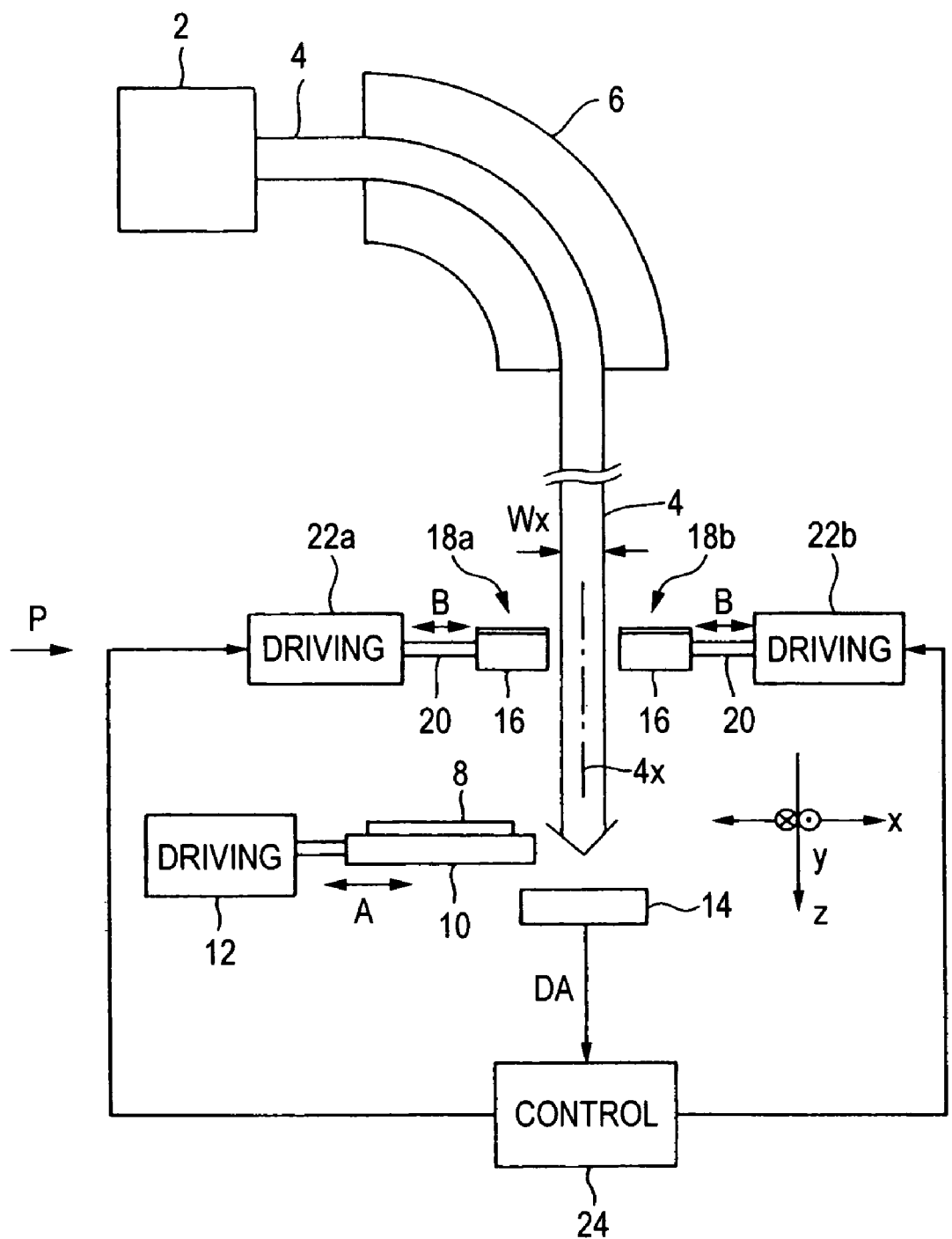
FIG. 1 is a plan view showing an embodiment of the ion beam irradiating apparatus of the invention.
Figure 2:
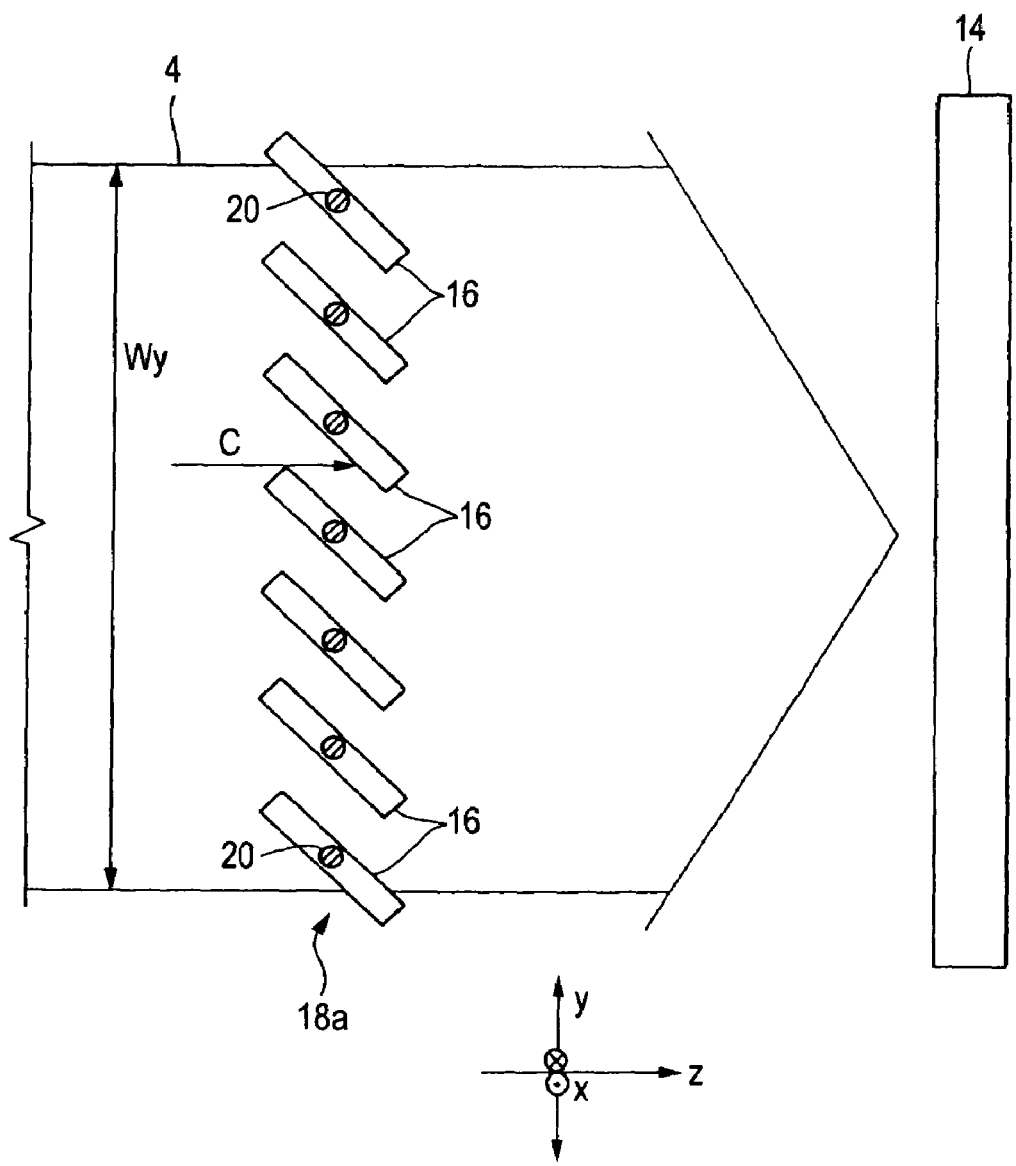
FIG. 2 is a side view partly showing the periphery of movable shielding plates in FIG. 1, looking in the direction of the arrow P.

FIG. 1 is a plan view showing an embodiment of the ion beam irradiating apparatus of the invention, and FIG. 2 is a side view partly showing the periphery of movable shielding plates in FIG. 1, looking in the direction of the arrow P.

The ion beam irradiating apparatus is configured so that an ion beam 4 extracted from an ion source 2 passes through a mass separator 6 to be subjected to a mass separating process, is further accelerated or decelerated as required, and thereafter impinges on a target 8 held by a holder 10 to apply a process such as ion implantation on the target 8. The path of the ion beam 4 is maintained to a vacuum. In some cases, the mass separator 6 is not disposed. In the case where ion implantation is performed on the target 8, the apparatus is also called an ion implanting apparatus.

The ion beam 4 which is to be impinged on the target 8 has a shape in which the size $W_y$ in y direction (the longitudinal direction, for example, vertical direction) in a plane intersecting with (e.g., perpendicular to) the traveling direction z is larger than the size $W_x$ in x direction (for example, horizontal direction) perpendicular to the y direction. The ion beam 4 having such a shape is called a ribbon-like ion beam, and sometimes called a sheet-like or strip-like ion beam. However, this does not mean that the size $W_x$ in the x direction is as thin as paper. For example, the size $W_y$ in the y direction is about 350 to 400 mm, and the size $W_x$ in the x direction is about 80 to 100 mm.

In the embodiment, in the ion beam 4, the shape itself which has not undergone scanning in the y direction, and namely which is obtained as result of extraction from the ion source 2 is formed into a ribbon-like shape. As described above, however, the ion beam 4 which is to impinge on the target 8 may have a ribbon-like shape after, for example, the ion beam undergoes scanning in the y direction (for example, parallel scanning) in the downstream side of the mass separator 6.

For example, the target 8 is a semiconductor substrate, a glass substrate, or the like.

In the embodiment, the target 8 is held by the holder 10, and, as indicated by the arrow A, mechanically reciprocated (mechanical-scanned) in the x direction by a target driving device 12. The size $W_y$ in the y direction of the ion beam 4 is slightly larger than the size in the same direction of the target 8. Because of this size relationship and the above-mentioned reciprocal driving, the whole face of the target 8 can be irradiated with the ion beam 4.

In the vicinity of the target 8 which is at the irradiation position of the ion beam 4, or in the embodiment, for example, in the vicinity of the rear side of the target 8, a beam profile monitor 14 which receives the ion beam 4, and which measures the beam current density distribution in at least the y direction of the ion beam 4 in the vicinity of the position of the target 8 is disposed. During the measurement by the monitor, the target 8 may be moved to a position where it does not impede the measurement. The beam profile monitor 14 outputs measurement information DA.

The beam profile monitor 14 may be a one-dimensional measuring instrument which measures the beam current density distribution in the y direction of the ion beam 4, or a two-dimensional measuring instrument which measures the beam current density distributions in both the y and x directions of the ion beam 4. For example, the beam profile monitor 14 has a configuration in which many measuring instruments (e.g., Faraday cups) for measuring the beam current density of the ion beam 4 are juxtaposed in the y direction, or in the y and x directions.

In the embodiment, a first movable shielding plate group 18a and a second movable shielding plate group 18b are disposed on the both sides in the x direction of the path of the ion beam 4 on the upstream side of the position of the target 8. Each of the movable shielding plate groups 18a, 18b has plural movable shielding plates 16 which are arranged on a substantially linear line in the y direction in a multistage manner, which are mutually independently movable along the x direction, and which are used for blocking the ion beam 4. The movable shielding plates 16 constituting the movable shielding plate groups 18a, 18b are placed so as to be respectively opposed in the x direction to each other across the path of the ion beam 4. Namely, the movable shielding plates are placed symmetrically in the x direction about the center 4x in the x direction of the ion beam 4.

In the embodiment, referring to FIG. 2, the movable shielding plates 16 constituting the movable shielding plate groups 18a, 18b are placed so that, as in a louver, the movable shielding plates are inclined with respect to the y direction, and adjacent ones of the movable shielding plates 16 are separated from each other. Moreover, the movable shielding plates 16 are placed so that the position of the upper end of one movable shielding plate 16, and that of the lower end of the upper movable shielding plate 16 slightly overlap with each other in the y direction, and a gap is not formed between adjacent movable shielding plates 16 as seen in the traveling direction z of the ion beam 4. As indicated by the arrow C in FIG. 2, therefore, the ion beam 4 cannot pass between adjacent movable shielding plates 16 which are at the same x-direction position.

Figure 9:
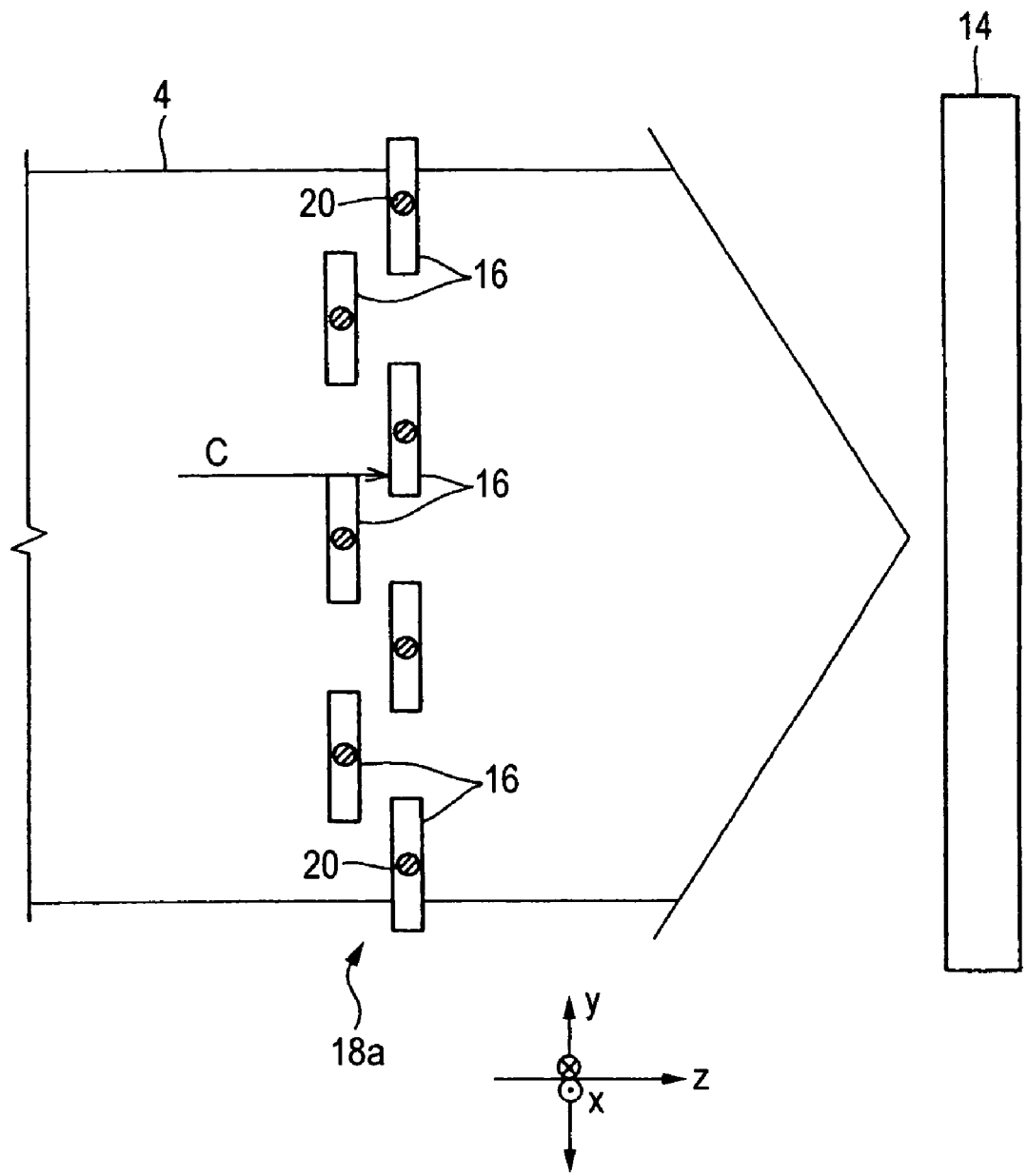
FIG. 9 is a view showing another example of the arrangement of the movable shielding plates, and corresponding to FIG. 2.

Although only the first movable shielding plate group 18a is illustrated in FIG. 2, the second movable shielding plate group 18b which is configured in the same manner as the first movable shielding plate group 18a is disposed across the ion beam 4 in the rearward direction of the sheet face. This is applicable also to FIGS. 9 and 10.

As indicated by the arrow B in FIG. 1, the movable shielding plates 16 constituting the first movable shielding plate group 18a are reciprocally driven along the x direction in a mutually independent manner via coupling rods 20 by first shielding-plate driving devices 22a. Similarly, the movable shielding plates 16 constituting the second movable shielding plate group 18b are reciprocally driven along the x direction in a mutually independent manner via coupling rods 20 by second shielding-plate driving devices 22b. According to the configuration, a part of the ion beam 4 can be blocked by the movable shielding plates 16, and the amount of blocking the ion beam (the blocking amount) by the movable shielding plates can be adjusted.

The shielding-plate driving devices 22a may be disposed in the same number as the movable shielding plates 16 so that each shielding-plate driving device 22a drives each movable shielding plate 16 as described above. Alternatively, one shielding-plate driving device 22a may drive plural movable shielding plates 16 in the manner as described above. In the embodiment, the former configuration is employed. This is applicable also to the shielding-plate driving devices 22b.

The embodiment further comprises a shielding-plate controlling device 24. On the basis of the measurement information DA supplied from the beam profile monitor 14, the shielding-plate controlling device 24 controls the shielding-plate driving devices 22a, 22b so as to, by a substantially same distance in opposite directions along the x direction (i.e., symmetrically about the center 4x in the x direction of the ion beam 4), move the movable shielding plates 16 which are opposed to each other across the ion beam path, among the movable shielding plates 16 constituting the movable shielding plate groups 18a, 18b. Therefore, a control of improving uniformity of the y-direction beam current density distribution of the ion beam 4 is performed by performing at least one of (a) a relative increase of the amount of blocking the ion beam 4 by the opposed movable shielding plates 16 which correspond to a position where the measured y-direction beam current density is relatively large, and (b) a relative decrease of the amount of blocking the ion beam 4 by the opposed movable shielding plates 16 which correspond to a position where the measured y-direction beam current density is relatively small. A specific example of the contents of the control of adjusting the beam uniformity by using the shielding-plate controlling device 24 will be described later. The term "relative" means comparing the amount with another amount.

According to the ion beam irradiating apparatus, therefore, the amount of blocking the ion beam 4 by the movable shielding plates 16 can be automatically controlled, so that uniformity of the beam current density distribution in the y direction (longitudinal direction) of the ion beam 4 is improved. In the ion beam irradiating apparatus, unlike the technique disclosed in Patent Reference 1, the ion beam 4 is not diverged or focused at adjusting places by means of a magnetic field or an electric field, and hence the parallelism and divergence angle of the ion beam 4 are not adversely affected. Namely, uniformity of the y-direction beam current density distribution of the ion beam 4 can be improved without adversely affecting the quality of the ion beam 4 such as the parallelism and the divergence angle. As a result, uniformity of the y-direction process on the target 8 can be enhanced.

In the embodiment, the control is performed so that, among the movable shielding plates 16 constituting the first and second movable shielding plate groups 18a, 18b, the movable shielding plates 16 which are opposed to each other across the ion beam path are moved by a substantially same distance along the x direction in opposite directions (namely, in a symmetrical manner as described above). Even when the amount of blocking the ion beam 4 by the movable shielding plates 16 is changed, therefore, the center position in the x direction of the ion beam 4 passing between the opposed movable shielding plates 16 is not shifted.

Figure 3A:
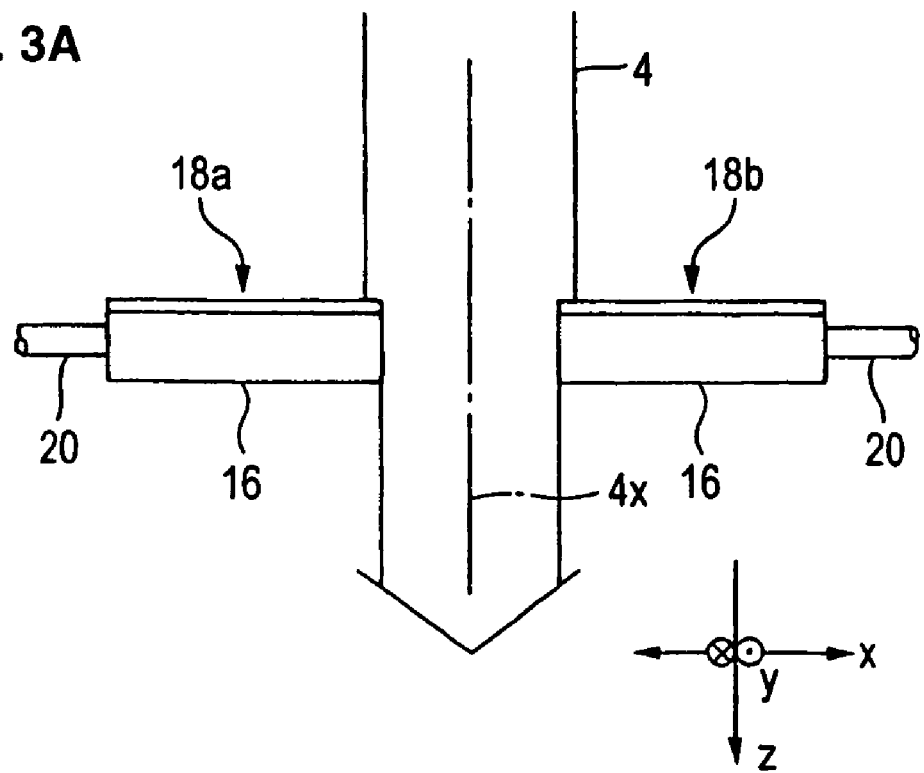
FIG. 3A is a plan view enlargedly showing an example in the case where an amount of blocking an ion beam by the movable shielding plates is small.
Figure 3B:
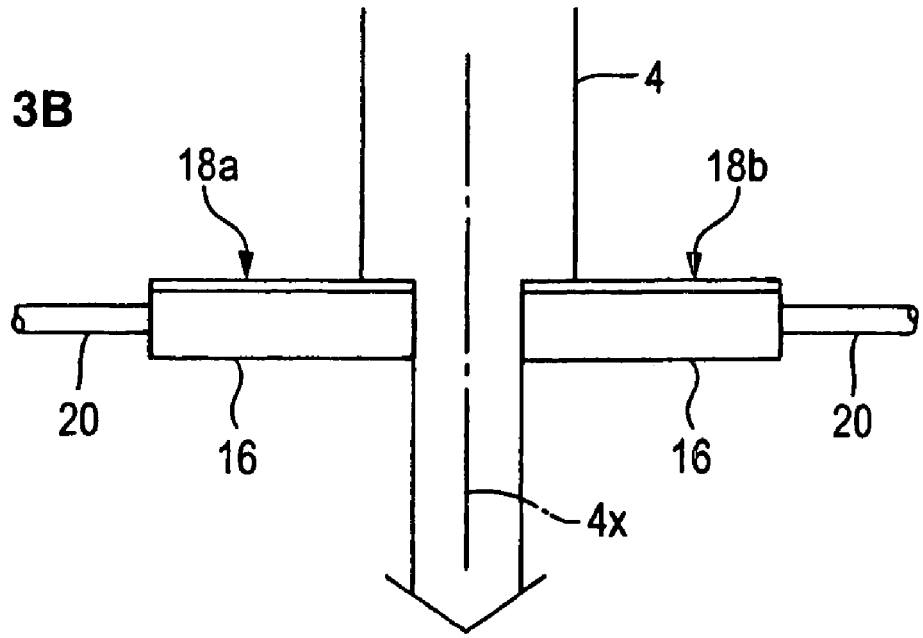
FIG. 3B is a plan view enlargedly showing an example in the case where the blocking amount is large.

This will be described with reference to FIG. 3. FIG. 3A shows an example in the case where the blocking amount is small, and FIG. 3B shows an example in the case where the blocking amount is large. In both the cases, the position of the center 4x in the x direction of the ion beam 4 passing between the opposed movable shielding plates 16 is substantially identical with that of the center 4x before the ion beam passes between the movable shielding plates 16. Namely, the center 4x is not shifted in accordance with the magnitude of the blocking amount. If the center 4x is shifted, the position where the ion beam is cut off is shifted in accordance with the magnitude of the blocking amount, thereby causing a case where the quality of the ion beam 4 such as the parallelism and the divergence angle is slightly changed. According to the embodiment, it is possible to prevent such a situation from occurring.

In the embodiment, as described above, the movable shielding plates 16 constituting the movable shielding plate groups 18a, 18b are placed so that a gap is not formed between adjacent movable shielding plates 16 as seen in the traveling direction z of the ion beam 4. Therefore, the ion beam 4 can be prevented from leaking from a gap between adjacent movable shielding plates 16 toward the downstream side. If leaking toward the downstream side occurs, the driving distance in the x direction of the target 8 must be increased in order to avoid the leaking ion beam 4. According to the embodiment, it is possible to prevent such a situation from occurring.

Figure 10:
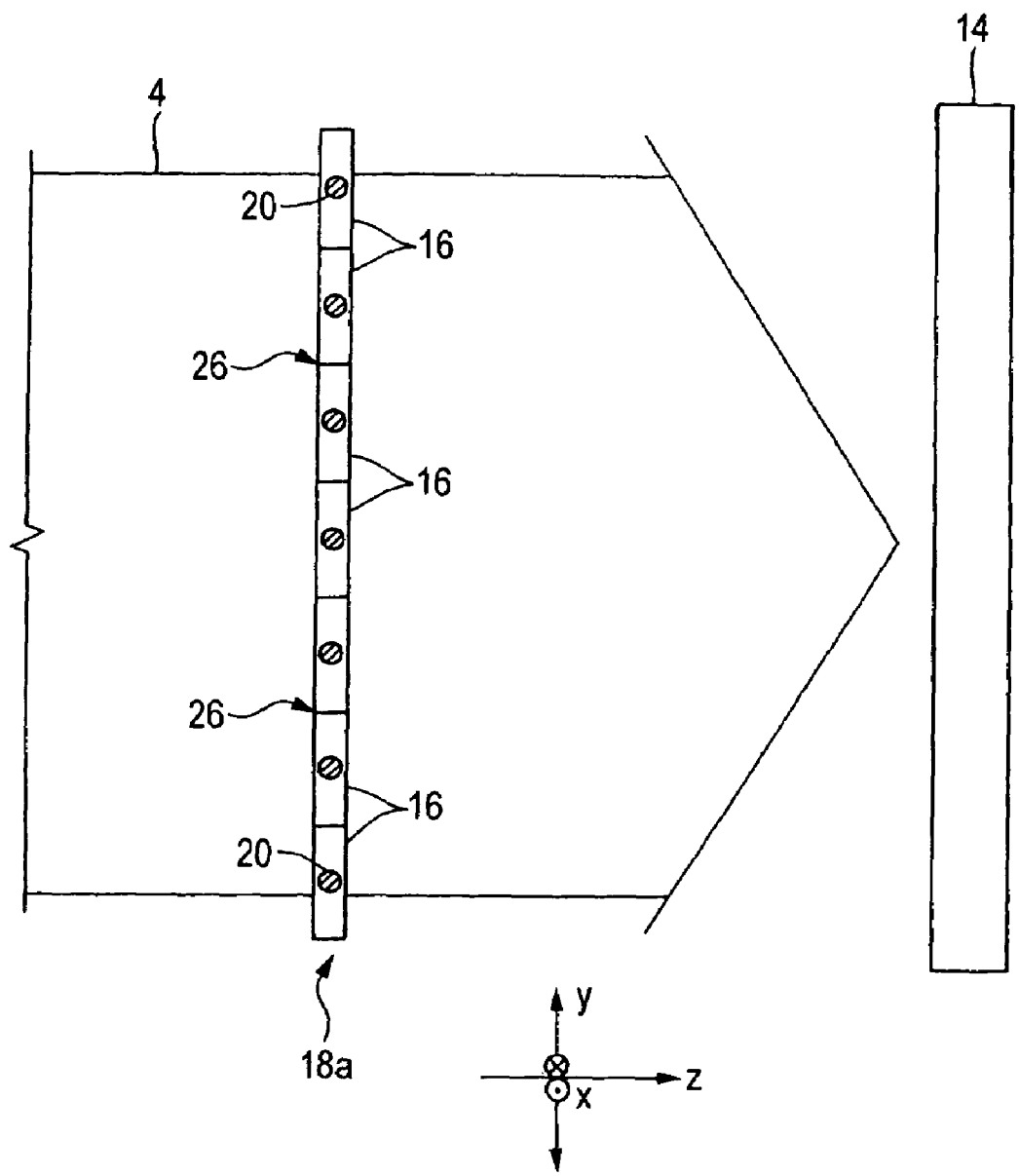
FIG. 10 is a view showing a further example of the arrangement of the movable shielding plates, and corresponding to FIG. 2.

In order to prevent the ion beam 4 from leaking from a gap between adjacent movable shielding plates 16 toward the downstream side, as shown in an example of FIG. 10, a configuration where plural movable shielding plates 16 are arranged on a substantially linear line in the y direction and approximately in parallel in the y direction, and a gap in the interface 26 between adjacent movable shielding plates 16 is eliminated may be employed. In the configuration, however, adjacent movable shielding plates 16 rub with each other in the interface 26 to produce particles, thereby causing a problem in that the particles may contaminate the surface of the target 8. In the embodiment, by contrast, the movable shielding plates 16 are inclined, and adjacent ones of the movable-shielding plates 16 are separated from each other as shown in FIG. 2, and therefore it is possible to prevent adjacent movable shielding plates 16 from rubbing with each other to produce particles. According to the embodiment, while preventing adjacent movable shielding plates 16 from rubbing with each other to produce particles, the ion beam 4 can be prevented from leaking from a gap between adjacent movable shielding plates 16 toward the downstream side.

Figure 4:
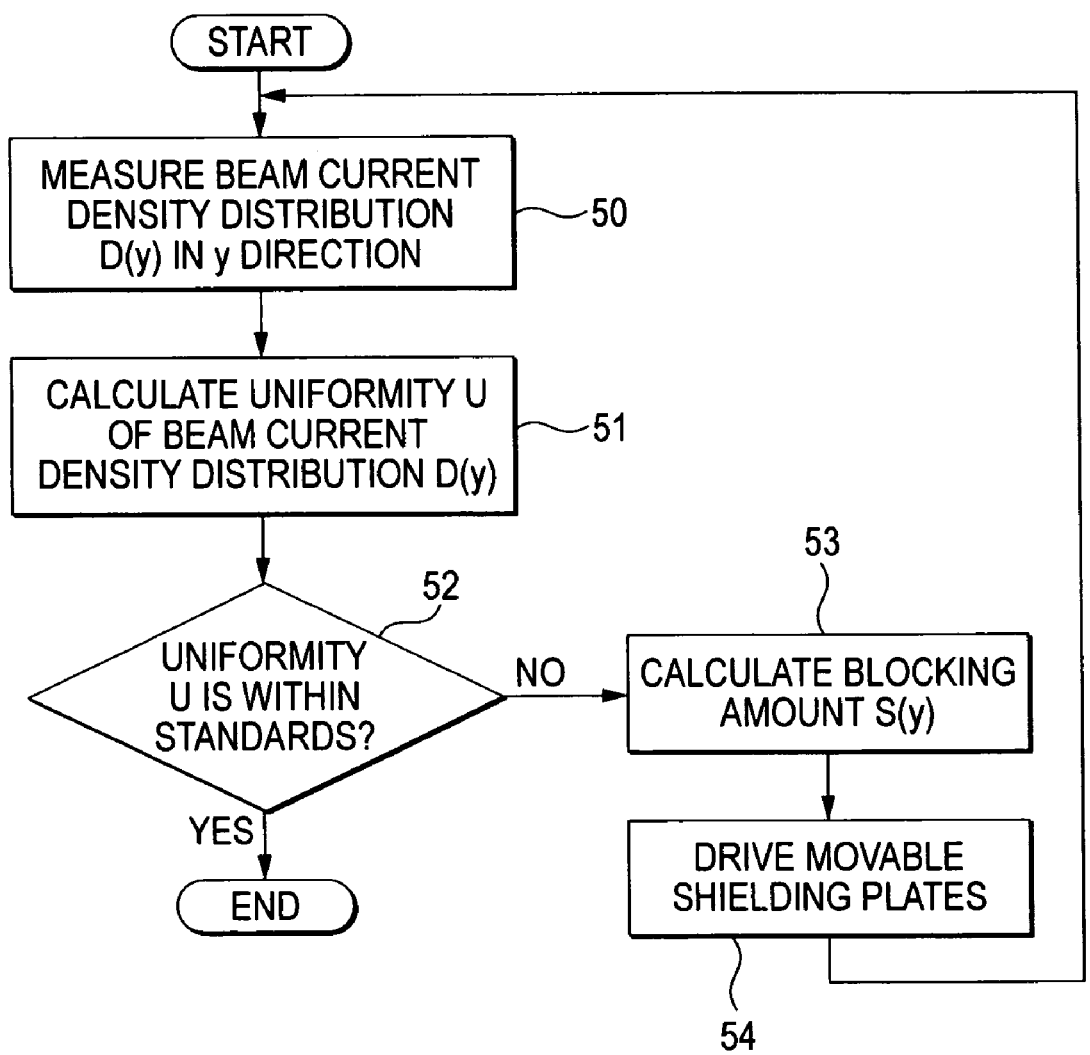
FIG. 4 is a flowchart showing one example of contents of a control of adjusting beam uniformity by using a shielding-plate controlling device in FIG. 1.
Figure 5:
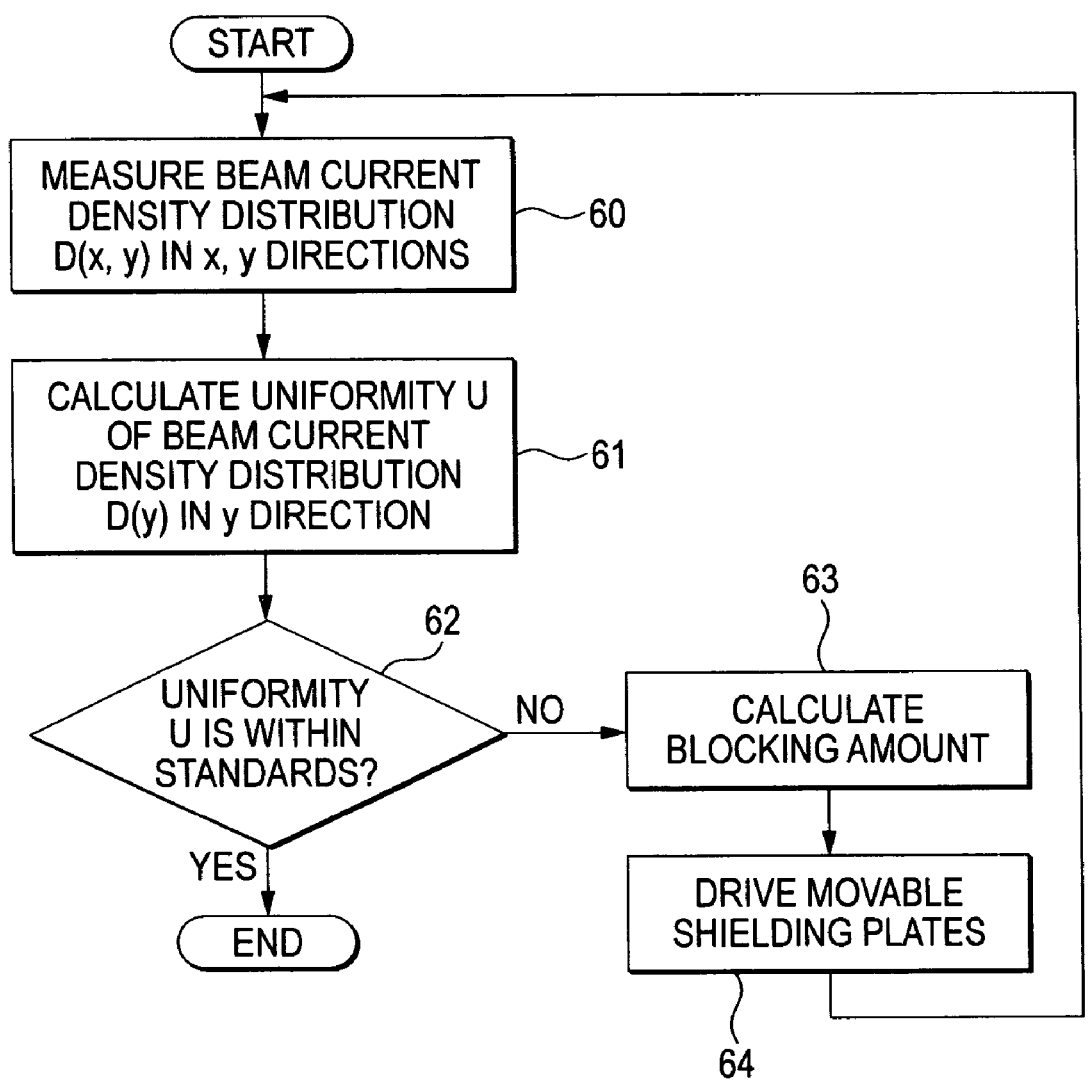
FIG. 5 is a flowchart showing another example of contents of the control of adjusting beam uniformity by using the shielding-plate controlling device in FIG. 1.
Figure 6:
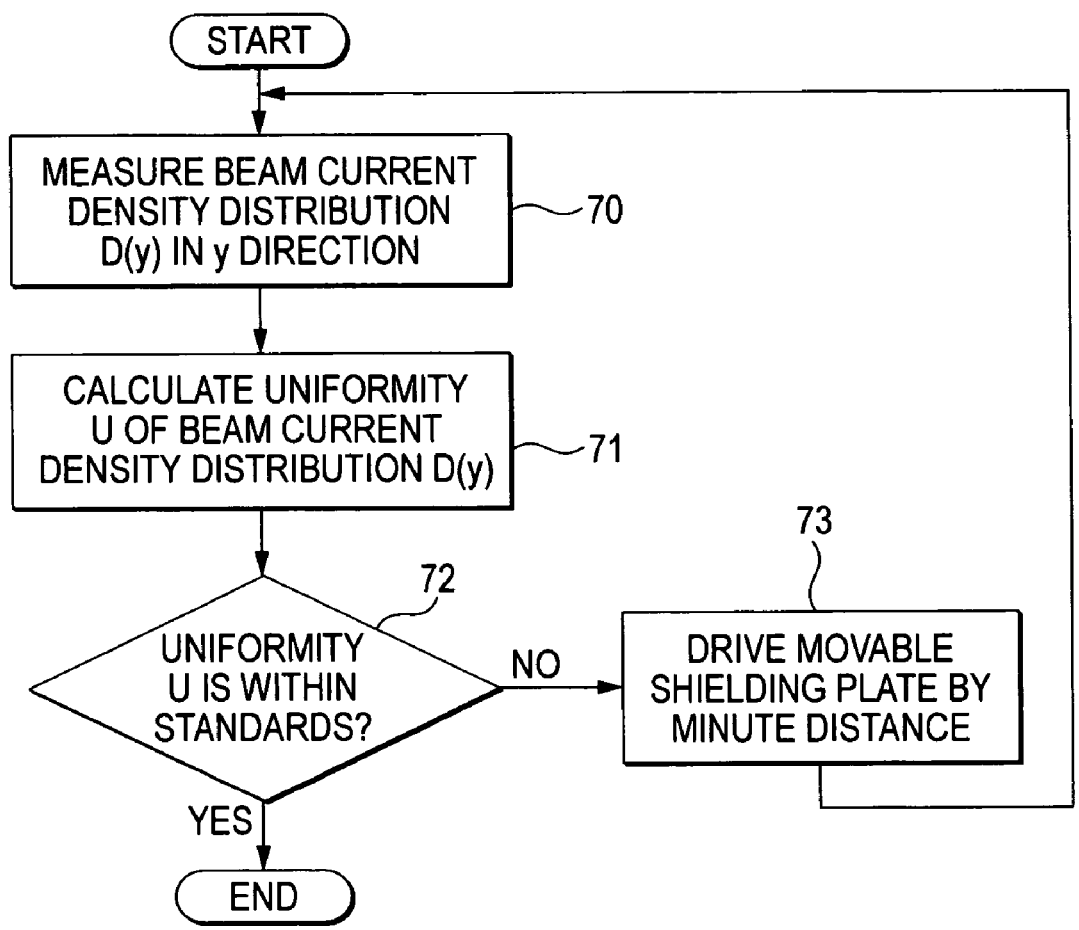
FIG. 6 is a flowchart showing a further example of contents of the control of adjusting beam uniformity by using the shielding-plate controlling device in FIG. 1.

Next, FIGS. 4 to 6 show more specific examples of the contents of the control of adjusting the beam uniformity by using the shielding-plate controlling device 24, respectively. FIGS. 4 and 6 show examples of a case where the x-direction beam current density of the ion beam 4 is assumed to be constant and nonuniformity of the beam current density is not considered. FIG. 5 shows an example of a case where non-uniformity of the x-direction beam current density of the ion beam 4 is considered.

Figure 7A:
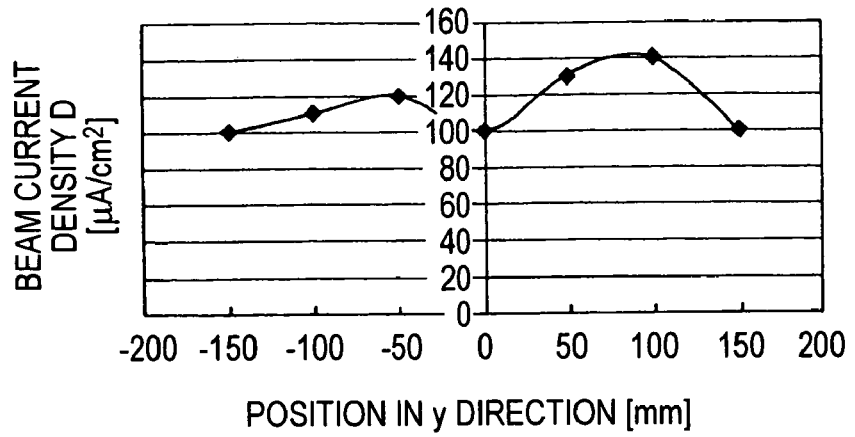
FIG. 7A is a view showing an example of a beam current density distribution before the uniformity adjustment in case of the control contents shown in FIG. 4.

In the example shown in FIG. 4, the beam profile monitor 14 measures the beam current density distribution D(y) in the y direction of the ion beam 4 (step 50). On the basis of the measurement information DA, the shielding-plate controlling device 24 performs the following process. In the above, (y) indicates a function of a position in the y direction. FIG. 7A shows an example the beam current density distribution D(y).

First, uniformity U of the beam current density distribution D(y) is calculated in accordance with, for example, Exp. 1 below (step 51).

$$U = \sigma/M \qquad [\text{Exp. 1}]$$

In the expression, M is the mean value of the beam current density distribution D(y), and σ is a standard deviation indicated by following Exp. 2. In Exp. 2, $D_i$ is the beam current density distribution D(y) in the form of a discrete quantity, n is the number of measurement points in the y direction, and i is the measurement points (i=1, 2, ..., n).

$$\sigma = \sqrt{\frac{1}{n}\sum_{i=1}^{n}(D_i - M)^2} \qquad [\text{Exp. 2}]$$

Then, it is determined whether the calculated uniformity U is within predetermined standards or not (step 52). If the uniformity is within the standards, it is not required to move the movable shielding plates 16, and hence the process of adjusting the beam uniformity is ended. After the adjusting process is ended, for example, a process of irradiating the target 8 with the ion beam 4 (e.g., ion implantation) may be performed (the same will apply hereinafter). If the uniformity U is not within the standards, the amount S(y) of blocking the ion beam 4 by the movable shielding plate 16 at each point in the y direction is calculated by, for example, Exp. 3 below (step 53).

$$S(y) = R(y) \cdot W_x \qquad [\text{Exp. 3}]$$

Figure 7B:
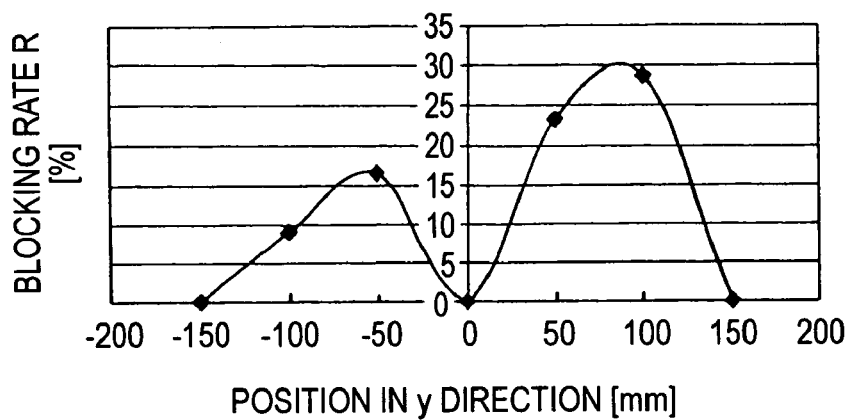
FIG. 7B is a view showing an example of a blocking rate of the ion beam by the movable shielding plates.

In the expression, R(y) is a blocking rate at each point in the y direction indicated by following Exp. 4, $W_x$ is the above-mentioned size in the x direction of the ion beam 4, and $D_{min}$ is the minimum value of the beam current density in the y direction. In this example, briefly speaking, the blocking rate R(y) is calculated so that the beam current density in the y direction coincides with the smallest value. FIG. 7B shows an example of the blocking rate R(y).

$$R(y) = (D(y) - D_{min})/D(y) \qquad [\text{Exp. 4}]$$

Then, each of the movable shielding plates 16 in the y direction is driven by the blocking amount S(y) (step 54). More specifically, each of the movable shielding plates 16 in the y direction is moved by the distance of the blocking amount S(y) toward the inner side (the side of the center 4x of the ion beam 4). In this case, the blocking amount S(y) is the total of blocking amounts on both sides in the x direction of the ion beam 4. When the movable shielding plates 16 which are opposed to each other across the ion beam path are symmetrically driven as in the embodiment, the moving distance of the movable shielding plate 16 on one side is set to one half of the blocking amount S(y).

Figure 7C:
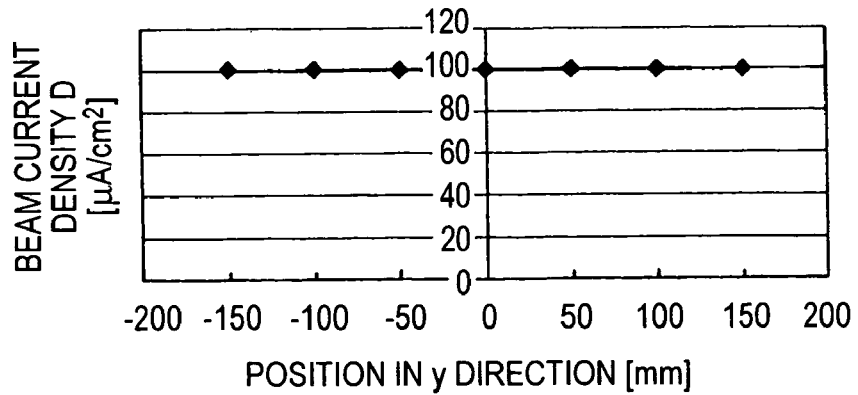
FIG. 7C is a view showing an example of an ideal shape of the beam current density distribution after the uniformity adjustment.

As a result, the amount of blocking the ion beam 4 by the movable shielding plates 16 can be automatically controlled, so that uniformity of the beam current density distribution D(y) in the y direction of the ion beam 4 is improved. Ideally, the beam current density distribution D(y) can be uniformed as shown in FIG. 7C.

In the example shown in FIG. 5, a two-dimensional beam current density distribution D(x, y) in the x and y directions of the ion beam 4 is measured by the beam profile monitor 14 (step 60), and the following process is performed by the shielding-plate controlling device 24 on the basis of the measurement information DA.

The uniformity U of the beam current density distribution D(y) in the y direction of the ion beam 4 is calculated in the same manner as step 51 above (step 61). It is determined whether the calculated uniformity U is within predetermined standards or not in the same manner as step 52 above (step 62). If the uniformity is not within the standards, for example, the amount of blocking the ion beam 4 at each y-direction point by the movable shielding plates 16 is calculated in the following manner (step 63).

The amount of blocking the ion beam 4 at each y-direction position by the movable shielding plates 16 is calculated so that an integration value in the x direction of the beam current density D is constant for each y-direction position. In the case where the beam current density distribution in the x direction of the ion beam 4 at a certain y-direction position $y_1$ (for example, $y_1$=100 mm) is as shown in FIGS. 8A and 8B, for example, the integration value at the y-direction position $y_1$ corresponds to the hatched area $G_1$ in FIGS. 8A and 8B.

Figure 8A:
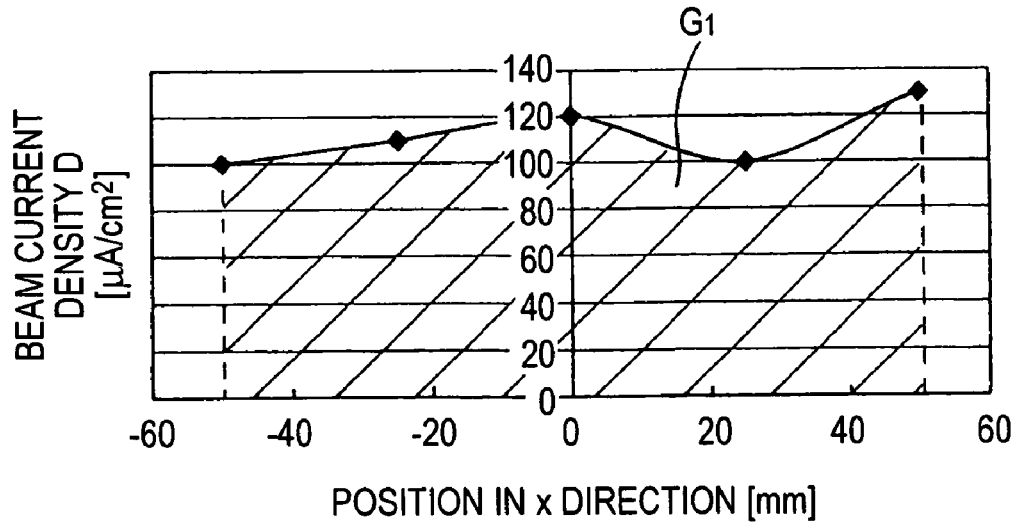
FIG. 8A is a view showing an example of an integration value in x direction of the beam current density at a certain y-direction position in case of the control contents shown in FIG. 5.
Figure 8B:
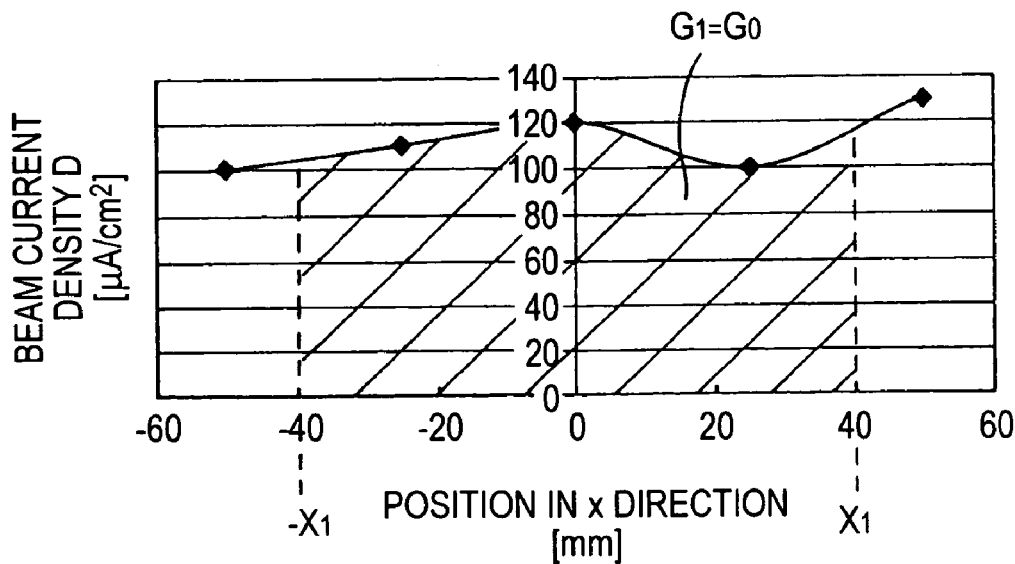
FIG. 8B is a view showing another example of an integration value in x direction of the beam current density at a certain y-direction position in case of the control contents shown in FIG. 5.

For example, it is assumed that the minimum value of the integration value at each y-direction point is $G_0$, and the integration value at the certain y-direction position $y_1$ before the movable shielding plates 16 are moved is $G_1$ ($>G_0$) as shown in FIG. 8A. The movement distance of the movable shielding plates 16 is calculated which is required for moving the movable shielding plates 16 to the inner side of the ion beam 4 to somewhat block the both sides of the ion beam 4 in this example, thereby substantially equalizing the integration value $G_1$ with the minimum integration value $G_0$. In the example shown in FIG. 8B, when the tip ends of the opposed movable shielding plates 16 are moved from the both respective sides toward the inner side to positions of $x_1$ and $-x_1$, respectively, $G_1=G_0$ is attained. This calculation of the moving distance (blocking amount) is performed for each of the y-direction points.

Then, the movable shielding plates 16 in the y direction are driven by the thus obtained moving distance (step 64). More specifically, the plates are moved toward the inner side.

As a result, the amount of blocking the ion beam 4 by the movable shielding plates 16 can be automatically controlled so that the integration value is substantially constant, and uniformity of the beam current density distribution D(y) in the y direction of the ion beam 4 can be improved.

In this example, the integration value is set as the reference, and the control is performed so as to make the integration value substantially constant. This is effective because, in the case where the target 8 is reciprocally driven in the x direction as in the embodiment shown in FIG. 1, the ion beam irradiation amount on the target 8 (for example, the ion implantation amount) is proportional to the integration value.

In the example shown in FIG. 6, in the same manner as step 50, the beam profile monitor 14 measures the beam current density distribution D(y) in the y direction of the ion beam 4 (step 70), and, on the basis of the measurement information DA, the shielding-plate controlling device 24 performs the following process.

Namely, uniformity U of the beam current density distribution D(y) in the y direction of the ion beam 4 is calculated in the same manner as step 51 (step 71). In the same manner as step 52, it is determined whether the calculated uniformity U is within predetermined standards or not (step 72). If the uniformity is not within the standards, the movable shielding plates 16 at a position where the beam current density D is larger than the minimum value $D_{min}$ is driven by a minute distance in the direction of blocking the ion beam 4 (step 73). The steps 70 to 73 are repeated until uniformity U is within the standards.

As a result, the amount of blocking the ion beam 4 by the movable shielding plates 16 can be automatically controlled, so that uniformity of the beam current density distribution D(y) in the y direction of the ion beam 4 can be improved. Ideally, the beam current density distribution D(y) can be uniformed as shown in FIG. 7C.

In the above, the apparatus comprising the shielding-plate controlling device 24 for performing the control in which movable shielding plates 16 corresponding to a position where the y-direction beam current density is relatively large are moved to the inner side, to relatively increase the amount of blocking the ion beam 4 by the movable shielding plates 16 has been described. By contrast, the apparatus may comprise a shielding-plate controlling device 24 for performing a control in which a state where the ion beam 4 is somewhat blocked by the movable shielding plates 16 is set as an initial state, and movable shielding plates 16 corresponding to a position where the y-direction beam current density is relatively small are moved to the outer side, to relatively decrease the amount of blocking the ion beam 4 by the movable shielding plates 16.

Alternatively, the apparatus may comprise a shielding-plate controlling device 24 for performing both of (a) the control of relatively increasing the amount of blocking the ion beam 4 by movable shielding plates 16 which correspond to a position where the measured y-direction beam current density is relatively large, and (b) the control of relatively decreasing the amount of blocking the ion beam 4 by movable shielding plates 16 which correspond to a position where the measured y-direction beam current density is relatively small.

From the viewpoint of improving uniformity of the y-direction beam current density distribution of the ion beam 4, it is not necessary to employ the configuration, or that in which opposed movable shielding plates 16 are symmetrically moved as in the above-described embodiment.

For example, plural movable shielding plates 16 such as described above, and a shielding-plate driving device for the plates and such as described above may be disposed on at least one side in the x direction of the path of the ion beam 4. For example, one (e.g., the group 18*a*) of the two movable shielding plate groups 18*a*, 18*b*, and a shielding-plate driving device (e.g., the device 22*a*) for the group are disposed. On the opposite side, shielding plates are not disposed, or a single stationary shielding plate which extends in the y direction is disposed. On the basis of the measurement information DA obtained by the beam profile monitor 14, the shielding-plate controlling device 24 controls the shielding-plate driving device 22*a* to perform at least one of (a) a relative increase of the amount of blocking the ion beam 4 by movable shielding plates 16 which correspond to a position where the measured y-direction beam current density is relatively large, and (b) a relative decrease of the amount of blocking the ion beam 4 by movable shielding plates 16 which correspond to a position where the measured y-direction beam current density is relatively small, thereby improving uniformity of the y-direction beam current density distribution.

In the case where a movable shielding plate group and a shielding-plate driving device for the group are disposed on only one side of the ion beam path, there is an advantage that the configuration can be simplified.

In place of employing the shielding-plate controlling device 24 which performs the above-described automatic control, the following method of adjusting uniformity of a beam may be employed. In the method, the beam profile monitor 14 and the first and second movable shielding plate groups 18*a*, 18*b* are used, and, on the basis of the measurement information DA obtained by the beam profile monitor 14, movable shielding plates 16 which are opposed to each other across the ion beam path among the movable shielding plates constituting the movable shielding plate groups 18*a*, 18*b* are moved by a manual operation or the like by a substantially same distance in opposite directions along the x direction, to perform at least one of (a) a relative increase of the amount of blocking the ion beam 4 by the opposed movable shielding plates 16 which correspond to a position where a measured y-direction beam current density is relatively large, and (b) a relative decrease of the amount of blocking the ion beam 4 by the opposed movable shielding plates 16 which correspond to a position where the measured y-direction beam current density is relatively small, thereby improving uniformity of the y-direction beam current density distribution. The adjusting method may be a method in which, for example, the process shown in FIG. 6 is performed in a human mediated manner (this is applicable also to the adjusting method which will be described later). In this case, the shielding-plate driving devices 22*a*, 22*b* may or may not be disposed. When the devices are disposed, the movable shielding plates 16 can be easily moved.

According to the beam uniformity adjusting method, the amount of blocking the ion beam 4 by the movable shielding plates 16 can be adjusted, and uniformity of the beam current density distribution in the y direction (longitudinal direction) of the ion beam 4 can be improved. Also in the adjusting method, the ion beam 4 is not diverged or focused at adjusting places by means of a magnetic field or an electric field, and hence the parallelism and divergence angle of the ion beam 4 are not adversely affected. Namely, uniformity of the y-direction beam current density distribution of the ion beam 4 can be improved without adversely affecting the quality of the ion beam 4 such as the parallelism and the divergence angle. As a result, uniformity of the y-direction process on the target 8 can be enhanced.

Furthermore, among the movable shielding plates 16 constituting the movable shielding plate groups 18a, 18b, movable shielding plates 16 which are opposed to each other across the ion beam path are moved by a substantially same distance along the x direction in opposite directions (namely, in a symmetrical manner as described above). Even when the amount of blocking the ion beam 4 by the movable shielding plates 16 is changed, therefore, the center position in the x direction of the ion beam 4 passing between the opposed movable shielding plates 16 is not shifted.

When the movable shielding plates 16 which are configured and placed as described with reference to FIG. 2 are employed, the ion beam 4 can be prevented from leaking from a gap between adjacent movable shielding plates 16 toward the downstream side, while preventing adjacent movable shielding plates 16 from rubbing with each other to produce particles.

From the viewpoint of improving uniformity of the y-direction beam current density distribution of the ion beam 4, it is not necessary to employ the above-described method, or that in which opposed movable shielding plates 16 are symmetrically moved.

For example, the following method of adjusting uniformity of a beam may be employed. Plural movable shielding plates 16 such as described above is disposed on at least one side in the x direction of the path of the ion beam 4. One (e.g., the group 18a) of the two movable shielding plate groups 18a, 18b is disposed. On the opposite side, shielding plates are not disposed, or a single stationary shielding plate which extends in the y direction is disposed. On the basis of the measurement information DA obtained by the beam profile monitor 14, at least one of (a) a process in which movable shielding plates 16 which correspond to a position where the measured y-direction beam current density is relatively large are moved along the x direction to relatively increase the amount of blocking the ion beam 4 by the movable shielding plates 16, and (b) that in which movable shielding plates 16 which correspond to a position where the measured y-direction beam current density is relatively small are moved along the x direction to relatively decrease the amount of blocking the ion beam 4 by the movable shielding plates 16 is performed by a manual operation to improve uniformity of the y-direction beam current density distribution. In this case, the shielding-plate driving devices (for example, the device 22a) may or may not be disposed. When the devices are disposed, the movable shielding plates 16 can be easily moved.

Figure 11:
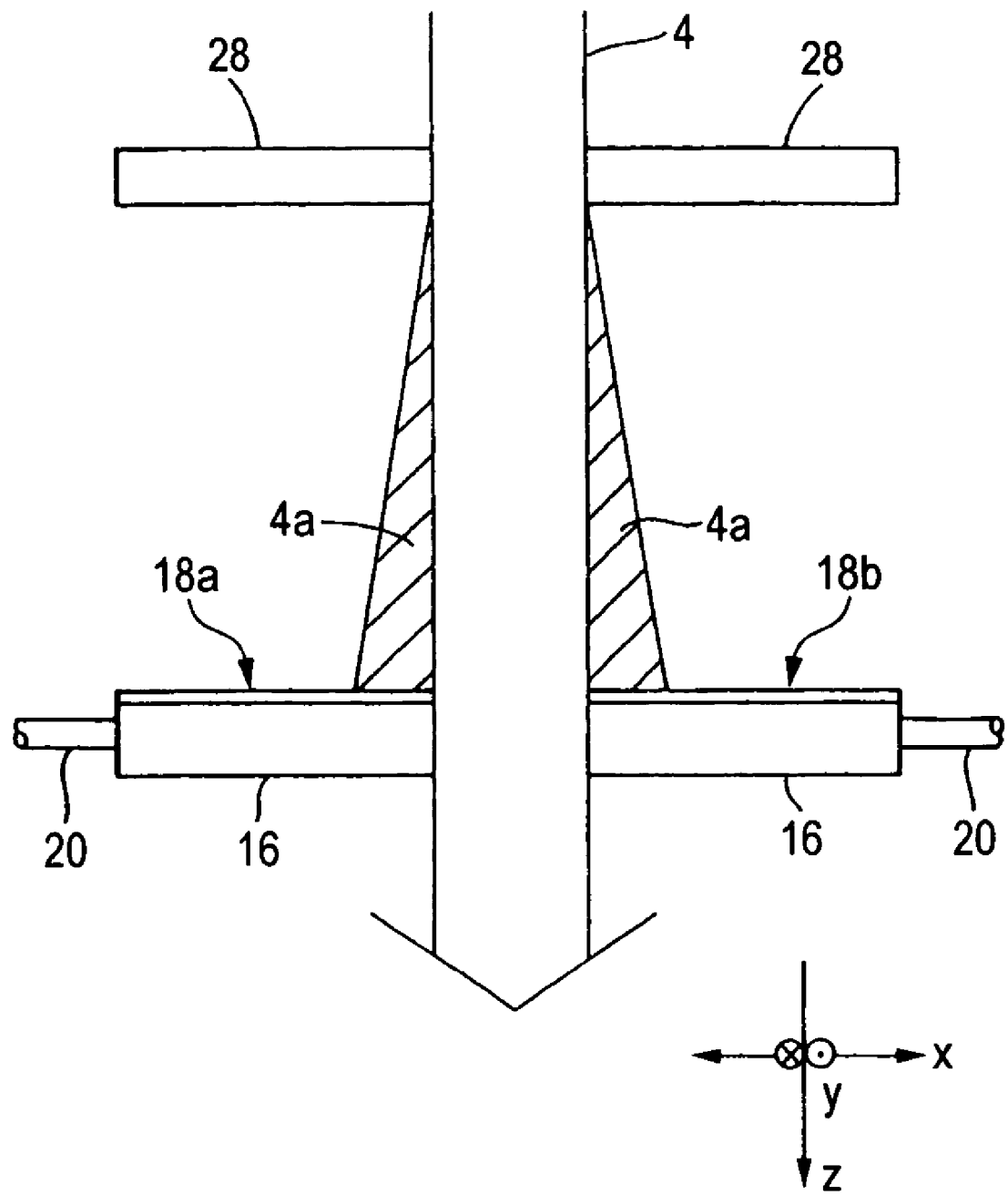
FIG. 11 is a plan view partly showing an example in which another shielding plate is disposed on the upstream side of the movable shielding plates.

In any of the above-described examples of the ion beam irradiating apparatus and the beam uniformity adjusting method, in the case where the movable shielding plates 16 are disposed on the both sides of the vicinity in the x direction of the ion beam path on the upstream side as in the example shown in FIG. 11, or the movable shielding plates 16 are disposed on only one side, a shielding plate 28 may be disposed on the same one side. The shielding plate 28 is not required to be movable. When such a shielding plate 28 is disposed, the plate 28 cooperates with the movable shielding plates 16 positioned on the downstream side to remove away components 4a (hatched portion) of the divergence angle of the ion beam 4, whereby the components 4a can be prevented from impinging on the target 8.

Drawings
FIG. 1
12 DRIVING
22a, 22b DRIVING
24 CONTROL
FIG. 4
a START
50 MEASURE BEAM CURRENT DENSITY DISTRIBUTION D(y) IN y DIRECTION
51 CALCULATE UNIFORMITY U OF BEAM CURRENT DENSITY DISTRIBUTION D(y)
52 UNIFORMITY U IS WITHIN STANDARDS?
53 CALCULATE BLOCKING AMOUNT S(y)
54 DRIVE MOVABLE SHIELDING PLATES
b END
FIG. 5
a START
60 MEASURE BEAM CURRENT DENSITY DISTRIBUTION D(x, y) IN x, y DIRECTIONS
51 CALCULATE UNIFORMITY U OF BEAM CURRENT DENSITY DISTRIBUTION D(y) IN y DIRECTION
52 UNIFORMITY U IS WITHIN STANDARDS?
53 CALCULATE BLOCKING AMOUNT
54 DRIVE MOVABLE SHIELDING PLATES
b END
FIG. 6
a START
70 MEASURE BEAM CURRENT DENSITY DISTRIBUTION D(y) IN y DIRECTION
71 CALCULATE UNIFORMITY U OF BEAM CURRENT DENSITY DISTRIBUTION D(y)
72 UNIFORMITY U IS WITHIN STANDARDS?
73 DRIVE MOVABLE SHIELDING PLATE BY MINUTE DISTANCE
b END
FIG. 7A
a BEAM CURRENT DENSITY D
b POSITION IN y DIRECTION
FIG. 7B
a BLOCKING RATE R
b POSITION IN y DIRECTION
FIG. 7C
a BEAM CURRENT DENSITY D
b POSITION IN y DIRECTION
FIGS. 8A, 8B
a BEAN CURRENT DENSITY D
b POSITION IN X DIRECTION

What is claimed is:

1. An ion beam irradiating apparatus which irradiates a target with an ion beam having a shape where a size in y direction in a plane intersecting with a traveling direction is larger than a size in x direction perpendicular to the y direction, said apparatus comprising:

a beam profile monitor which measures a beam current density distribution in at least the y direction of the ion beam in a vicinity of a position of said target;

a plurality of movable shielding plates which are arranged on at least one side in the x direction of an ion beam path on an upstream side of the position of said target, said movable shielding plates being mutually independently movable along the x direction, and blocking the ion beam;

a shielding-plate driving device which reciprocally drives said plurality of movable shielding plates along the x direction in a mutually independent manner; and a shielding-plate controlling device which controls said shielding-plate driving device on a basis of measurement information obtained by said beam profile monitor, and which performs at least one of: a relative increase of an amount of blocking the ion beam by said movable shielding plates which correspond to a position where a measured y-direction beam current density is relatively large; and a relative decrease of an amount of blocking the ion beam by said movable shielding plates which correspond to a position where the measured y-direction beam current density is relatively small, thereby performing a control of improving uniformity of a y-direction beam current density distribution.

2. An ion beam irradiating apparatus which irradiates a target with an ion beam having a shape where a size in y direction in a plane intersecting with a traveling direction is larger than a size in x direction perpendicular to the y direction, said apparatus comprising:

a beam profile monitor which measures a beam current density distribution in at least the y direction of the ion beam in a vicinity of a position of said target;

a first movable shielding plate group having a plurality of movable shielding plates which are arranged in the y direction on one side in the x direction of an ion beam path on an upstream side of the position of said target, said first movable shielding plates being mutually independently movable along the x direction, and blocking the ion beam;

a second movable shielding plate group having a plurality of movable shielding plates which are arranged in the y direction on another side in the x direction of the ion beam path on an upstream side of the position of said target, so as to be respectively opposed in the x direction to said shielding plates constituting said first movable shielding plate group across the ion beam path, said second movable shielding plates being mutually independently movable along the x direction, and blocking the ion beam;

a first shielding-plate driving device which reciprocally drives said movable shielding plates constituting said first movable shielding plate group, along the x direction in a mutually independent manner;

a second shielding-plate driving device which reciprocally drives said movable shielding plates constituting said second movable shielding plate group, along the x direction in a mutually independent manner; and a shielding-plate controlling device which controls said first and second shielding-plate driving devices on a basis of measurement information obtained by said beam profile monitor, and, by a substantially same distance in opposite directions along the x direction, moves movable shielding plates which are opposed to each other across the ion beam path, among said movable shielding plates constituting said first and second movable shielding plate groups, to perform at least one of: a relative increase of an amount of blocking the ion beam by said opposed movable shielding plates which correspond to a position where a measured y-direction beam current density is relatively large; and a relative decrease of an amount of blocking the ion beam by said opposed movable shielding plates which correspond to a position where the measured y-direction beam current density is relatively small, thereby performing a control of improving uniformity of a y-direction beam current density distribution.

3. An ion beam irradiating apparatus according to claim 1, wherein said movable shielding plates are placed so that said movable shielding plates are inclined with respect to the y direction, adjacent ones of said movable shielding plates are separated from each other, and a gap in the traveling direction of the ion beam is not formed between adjacent ones of said movable shielding plates.

4. A method of adjusting uniformity of a beam in an ion beam irradiating apparatus which irradiates a target with an ion beam having a shape where a size in y direction in a plane intersecting with a traveling direction is larger than a size in x direction perpendicular to the y direction, wherein said method uses a beam profile monitor which measures a beam current density distribution in at least the y direction of the ion beam in a vicinity of a position of said target, and a plurality of movable shielding plates which are arranged in the y direction on at least one side in the x direction of an ion beam path on an upstream side of the position of said target, said movable shielding plates being mutually independently movable along the x direction, and blocking the ion beam, said method comprising:

performing, on the basis of measurement information obtained by said beam profile monitor, at least one of: a process in which movable shielding plates which correspond to a position where a measured y-direction beam current density is relatively large are moved along the x direction to relatively increase an amount of blocking the ion beam by said movable shielding plates; and a process in which movable shielding plates which correspond to a position where the measured y-direction beam current density is relatively small are moved along the x direction to relatively decrease the amount of blocking the ion beam by said movable shielding plates, thereby improving uniformity of a y-direction beam current density distribution.

5. A method of adjusting uniformity of a beam in an ion beam irradiating apparatus which irradiates a target with an ion beam having a shape where a size in y direction in a plane intersecting with a traveling direction is larger than a size in x direction perpendicular to the y direction, wherein said method uses a beam profile monitor which measures a beam current density distribution in at least the y direction of the ion beam in a vicinity of a position of said target, and a first movable shielding plate group having a plurality of movable shielding plates which are arranged in the y direction on one side in the x direction of an ion beam path on an upstream side of the position of said target, said first movable shielding plates being mutually independently movable along the x direction, and blocking the ion beam, a second movable shielding plate group having a plurality of movable shielding plates which are arranged in the y direction on another side in the x direction of the ion beam path on an upstream side of the position of said target, so as to be respectively opposed in the x direction to said shielding plates constituting said first movable shielding plate group across the ion beam path, said second movable shielding plates being mutually independently movable along the x direction, and blocking the ion beam, said method comprising:

on the basis of measurement information obtained by said beam profile monitor, by a substantially same distance in opposite directions along the x direction, moving movable shielding plates which are opposed to each other across the ion beam path, among said movable shielding plates constituting said first and second movable shielding plate groups, to perform at least one of: a relative increase of an amount of blocking the ion beam by said opposed movable shielding plates which correspond to a position where a measured y-direction beam current density is relatively large; and a relative decrease of an amount of blocking the ion beam by said opposed movable shielding plates which correspond to a position where the measured y-direction beam current density is relatively small, thereby improving uniformity of a y-direction beam current density distribution.

6. A method of adjusting uniformity of a beam according to claim 4, wherein said movable shielding plates are placed so that said movable shielding plates are inclined with respect to the y direction, adjacent ones of said movable shielding plates are separated from each other, and a gap in the traveling direction of the ion beam is not formed between adjacent ones of said movable shielding plates.

7. An ion beam irradiating apparatus according to claim 1, further comprising:
a shielding plate which is disposed on the same one side as the movable shielding plates on an upstream side of the position of said movable shielding plates, the shielding plate cooperating with the movable shielding plates positioned on the downstream side.

8. An ion beam irradiating apparatus according to claim 2, wherein said movable shielding plates are placed so that said movable shielding plates are inclined with respect to the y direction, adjacent ones of said movable shielding plates are separated from each other, and a gap in the traveling direction of the ion beam is not formed between adjacent ones of said movable shielding plates.

9. A method of adjusting uniformity of a beam according to claim 5, wherein said movable shielding plates are placed so that said movable shielding plates are inclined with respect to the y direction, adjacent ones of said movable shielding plates are separated from each other, and a gap in the traveling direction of the ion beam is not formed between adjacent ones of said movable shielding plates.

10. An ion beam irradiating apparatus according to claim 2, further comprising:
a shielding plate which is disposed on the same one side as the movable shielding plates on an upstream side of the position of said movable shielding plates, the shielding plate cooperating with the movable shielding plates positioned on the downstream side.

* * * * *